United States Patent
Tsironis (10) Patent No.: US 10,686,239 B1
(45) Date of Patent: Jun. 16, 2020

(54) SLIDE SCREW TUNERS WITH OFFSET TUNING PROBES AND METHOD

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/569,897

(22) Filed: Sep. 13, 2019

Related U.S. Application Data (62) Division of application No. 16/038,431, filed on Jul. 18, 2018.

(51) Int. Cl.
| | |
|---|---|
| *H03H 7/40* | (2006.01) |
| *H01P 5/04* | (2006.01) |
| *H01P 5/18* | (2006.01) |
| *H04L 25/02* | (2006.01) |
| *G01R 31/28* | (2006.01) |
| *H03H 7/38* | (2006.01) |
| *G01R 31/26* | (2020.01) |

(52) U.S. Cl.
CPC ............ *H01P 5/04* (2013.01); *G01R 31/2614* (2013.01); *G01R 31/2822* (2013.01); *H01P 5/18* (2013.01); *H03H 7/38* (2013.01); *H04L 25/0278* (2013.01)

(58) Field of Classification Search
CPC ........ H03H 7/38; H03H 7/40; H04L 25/0278; G01R 31/2614; G01R 31/2822
USPC ............ 333/32, 33, 17.3, 263; 324/637, 641
See application file for complete search history.

(56) References Cited

U.S. PATENT DOCUMENTS

| | | |
|---|---|---|
| 6,674,293 B1 | 1/2004 | Tsironis |
| 8,188,816 B1 * | 5/2012 | Tsironis .................... H01P 5/04 333/17.3 |
| 8,427,255 B1 * | 4/2013 | Tsironis .................... H01P 5/04 333/17.3 |

OTHER PUBLICATIONS

"Load Pull" [online] Wikipedia, [Retrieved on Aug. 24, 2017]. Retrieved from Internet <URL:https://en.wikipedia.org/wiki/Load_pull>.
"Computer Controlled Microwave Tuner, CCMT", Product Note 41, Focus Microwaves Inc. 1998, pp. 2-4.
"Standing wave ratio" [online], Wikipedia, [Retrieved on Feb. 3, 2017]. Retrieved from Internet <URL:https://en.wikipedia.org/wiki/Standing_wave_ratio>.
"MPT, a universal Multi-Purpose Tuner", Product Note 79, Focus Microwaves Inc., Oct. 2004.
"On Wafer Load Pull Tuner Setups: A Design Help", Application Note 48, Focus Microwaves, Dec. 2001, p. 2 ff., Figure 2.

* cited by examiner

Primary Examiner — Stephen E. Jones (57) ABSTRACT

A passive slide screw load pull tuner structure can be used on-wafer, in millimeter-wave frequencies from 25 to 110 GHz and above. It uses special tuning probe brackets and a short slabline mounted below the tuner housing, which holds the control gear. The tuner is mounted under an angle matching the angle of the wafer-probe, is connected directly of the wafer-probe and ensures optimum tuning range.

2 Claims, 12 Drawing Sheets

SLIDE SCREW TUNERS WITH OFFSET TUNING PROBES AND METHOD

PRIORITY CLAIM

This application is a division of U.S. Non-Provisional patent application Ser. No. 16/038,431, filed Jul. 18, 2018, and titled "Slide Screw Tuners With Offset Tuning Probes and Method", which is incorporated herein by reference in its entirety.

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. "Standing wave ratio" [online], Wikipedia, [Retrieved on 2017 Feb. 3]. Retrieved from Internet <URL: https://en.wikipedia.org/wiki/Standing_wave_ratio>.
4. Tsironis, U.S. Pat. No. 6,674,293, "Adaptable pre-matched tuner system and method"
5. "MPT, a universal Multi-Purpose Tuner", Product Note 79, Focus Microwaves Inc., October 2004.
6. "On Wafer Load Pull Tuner Setups: A Design Help", Application Note 48, Focus Microwaves, December 2001, page 2 ff., FIG. 2.

BACKGROUND OF THE INVENTION

This invention relates to load and source pull testing of medium and high power RF transistors and amplifiers using remotely controlled electro-mechanical impedance tuners.

Modern design of high power RF amplifiers and mixers, used in various communication systems, requires accurate knowledge of the active device's (transistor's) characteristics. In such circuits, it is insufficient for the transistors, which operate in their highly non-linear regime, close to power saturation, to be described using non-linear numeric models only.

Figure 1:
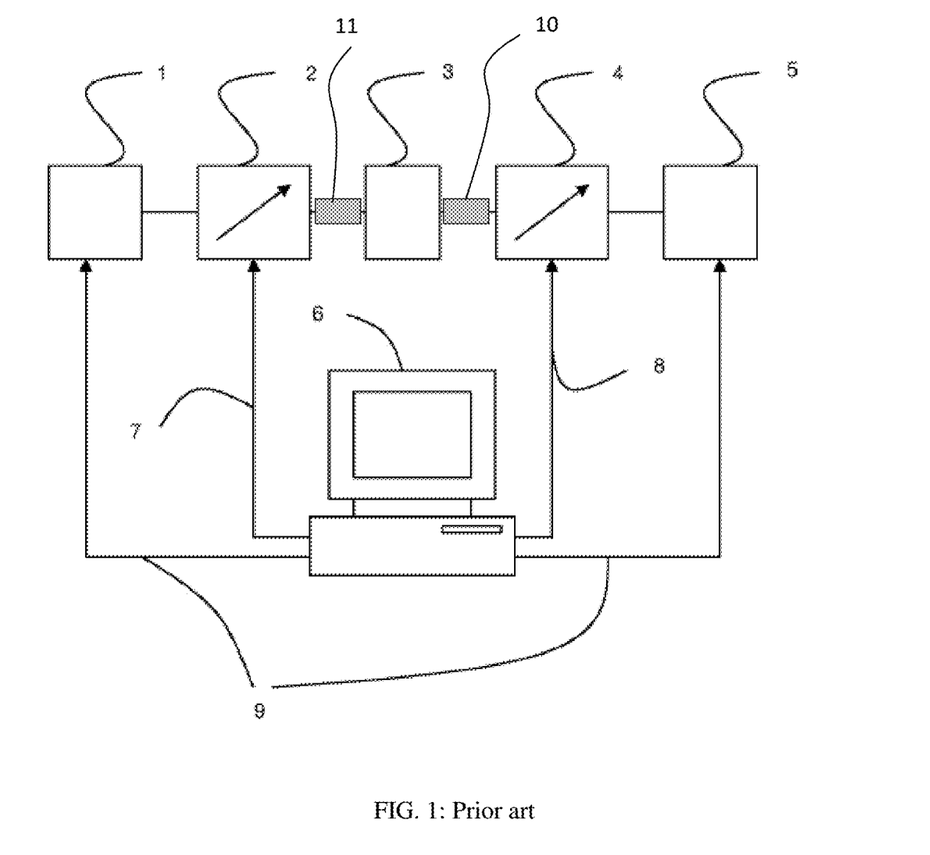
FIG. 1 depicts prior art, a typical automated transistor load pull test system.
Figure 3:
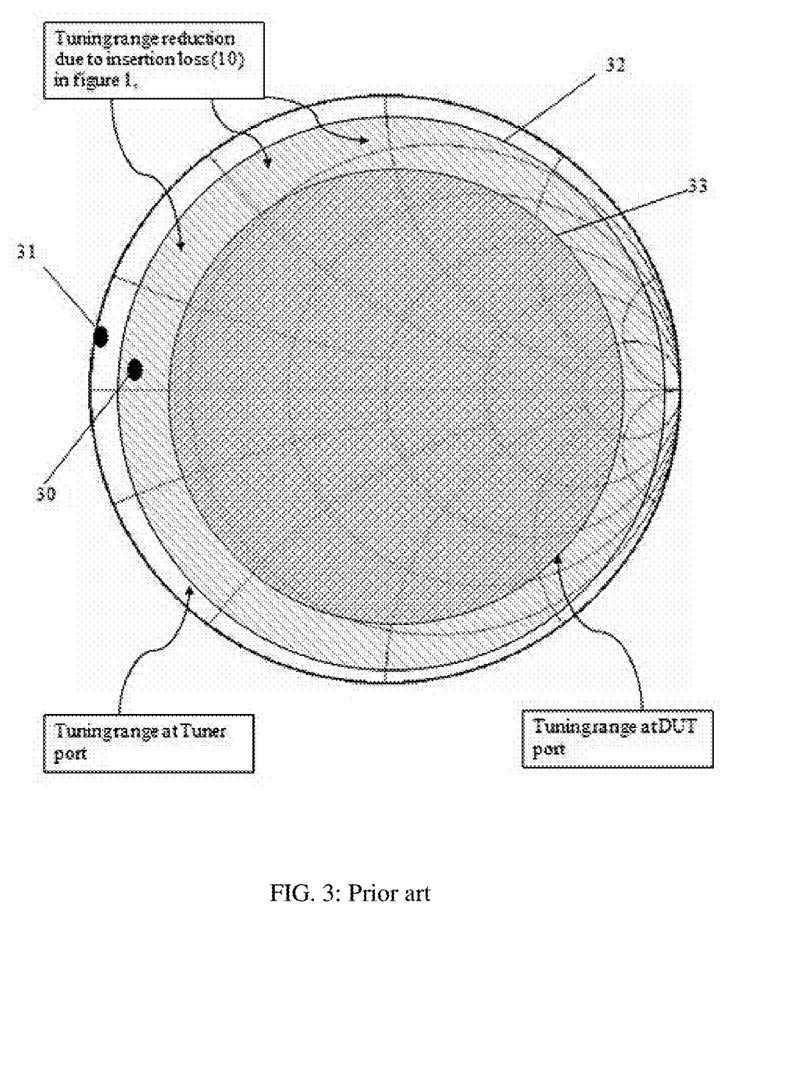
FIG. 3 depicts prior art, effect of insertion loss between tuner and DUT on tuning range.

A popular method for testing and characterizing such microwave and millimeter-wave transistors in the non-linear region of operation is "load pull" (FIG. 1). Load pull is a measurement technique employing impedance tuners 2, 4 and other test equipment, such as signal sources 1, test fixtures and DUT 3 and power meters 5, the whole controlled by a computer 6; the computer controls and communicates with the tuners 2,4 and other equipment 1, 5 using digital cables 7, 8, 9. The tuners are used in order to manipulate the microwave impedance conditions in a systematic and controlled manner under which the Device Under Test (DUT, or transistor) is tested (see ref. 1); tuners allow determining the optimum impedance conditions for designing amplifiers and other microwave components for specific performance targets, such as gain, efficiency, intermodulation etc.; this specification refers hence to "tuners" as being "impedance tuners", in order to distinct from "tuned receivers (radios)", commonly referred to as "tuners", because of the included tuning circuits (see ref. 2). Insertion loss between the DUT and the tuners 10, 11 reduce the tuning range (FIG. 3). It is a general aim in the technology to minimize this insertion loss 10, 11. This can be done by physically approaching the tuning core of the tuner (i.e. the tuning probe (slug)) to the DUT.

Figure 2:
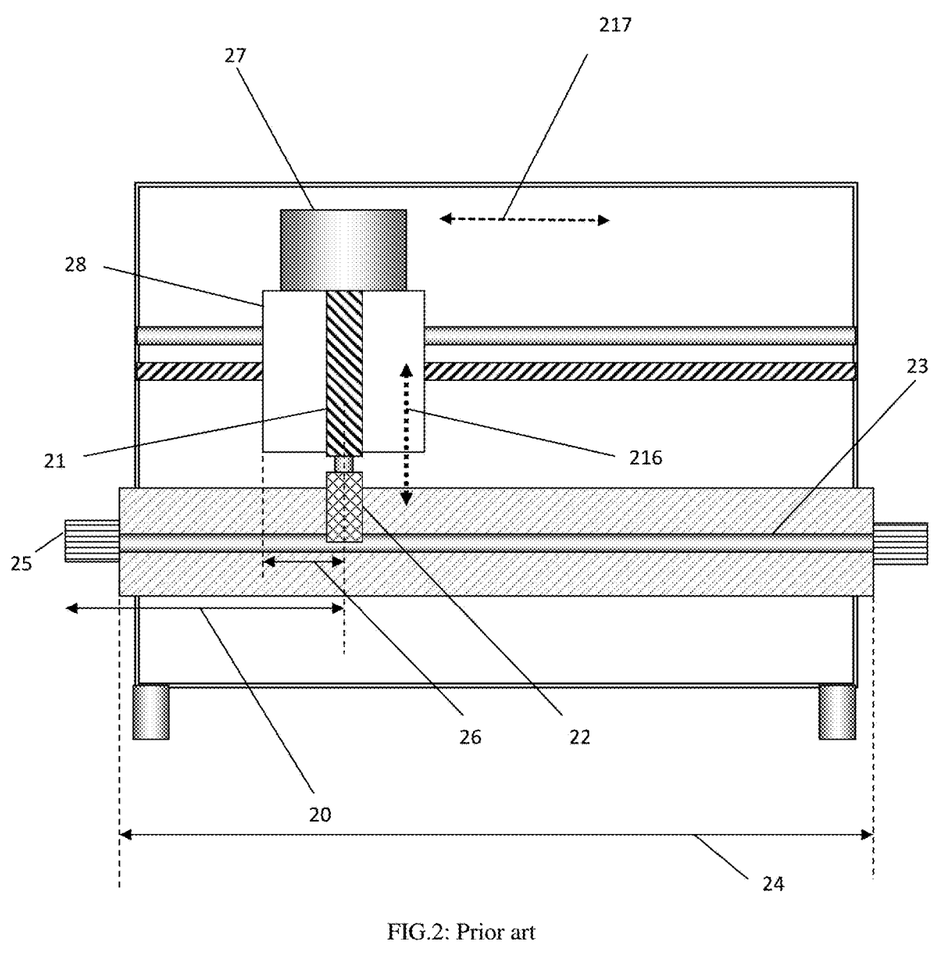
FIG. 2 depicts prior art, a cross section of an automated slide screw impedance tuner using a single vertical axis and RF probe (slug).

Impedance tuners consist, in general, of a transmission line with center conductor 23 and, one or more (see ref. 4) adjustable tuning probes 22, FIG. 2; the probe (slug) 22 is attached to a precision vertical axis 21, which is mounted in a mobile carriage 28; the axis 21, controlled by motor 27 can move the probe 22 vertically 216 in Y direction, starting at the top and moving towards the center conductor 23; the carriage 28 can move the probe 22 horizontally 217 (in X direction) either towards or away from the test port 25 (and the DUT, which is attached to the test port) parallel to the center conductor 23. The vertical movement 216 changes the amplitude of the reflection factor, seen at the tuner test port 25, whereas the horizontal movement 217 changes its phase. This way a large portion of Smith chart is covered allowing quasi-infinite impedances from a minimum value Zmin to a maximum value Zmax to be synthesized at any given frequency within the "tuning range" of the tuner. Typical values of state of the art tuners are |Zmin|=2Ω and |Zmax|=1250Ω; this corresponds to a Voltage Standing Wave Ratio (VSWR) of 25:1. The relation between reflection factor and impedance is given by $$\text{GAMMA} = |\text{GAMMA}| * \exp(j\Phi) = (Z-Zo)/(Z+Zo) \quad \{\text{eq. 1}\},$$

wherein Z is the complex impedance Z=R+jX and Zo is the characteristic impedance. |GAMMA| varies between 0 and 1; a typical value used for Zo is 50Ω (see ref. 3). The higher |GAMMA| the higher the "tuning range", see FIG. 3. The equivalent, offering higher reading resolution both for low and high |GAMMA| is the Voltage Standing Wave Ratio:

$$\text{VSWR} = (1+|\text{GAMMA}|)/(1-|\text{GAMMA}|) \quad \{\text{eq.2}\}$$

which varies between 1 and infinite.

Figure 4:
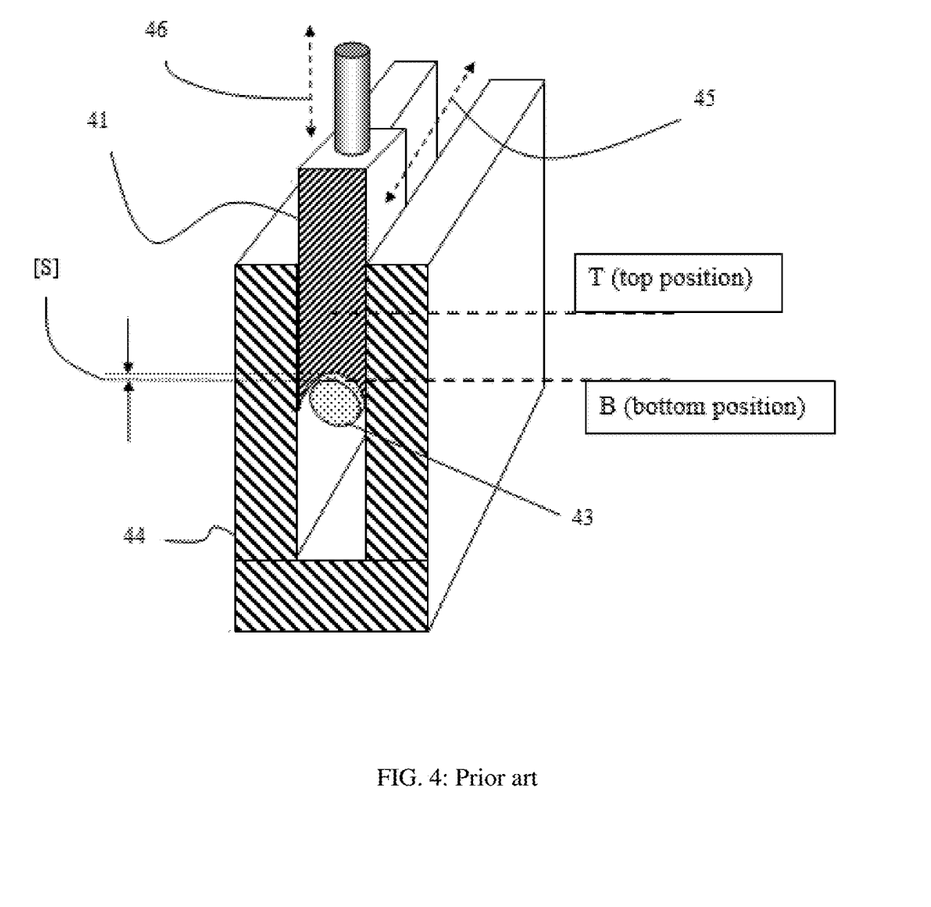
FIG. 4 depicts prior art, a perspective view of the tuning probe inside a slabline.

Metallic probes 22, 41 or "slugs" are made in a parallelepiped form 41 with a concave bottom, which allows to capture, when approaching the center conductor 43, the electric field which is concentrated in the area between the center conductor 43 and the ground planes of the slabline 44 (FIG. 4). This "field capturing" allows creating high and controllable reflection factors. The critical part is the required proximity [S] and accuracy of both the vertical 46 and horizontal 45 probe movement, whereby changes in the vertical probe position 46 of a few micrometers affects the VSWR by a large extent. This invention discloses a passive single and multi-probe tuner structure maximizing the tuning range up to 110 GHz.

BRIEF SUMMARY OF THE INVENTION

Figure 5:
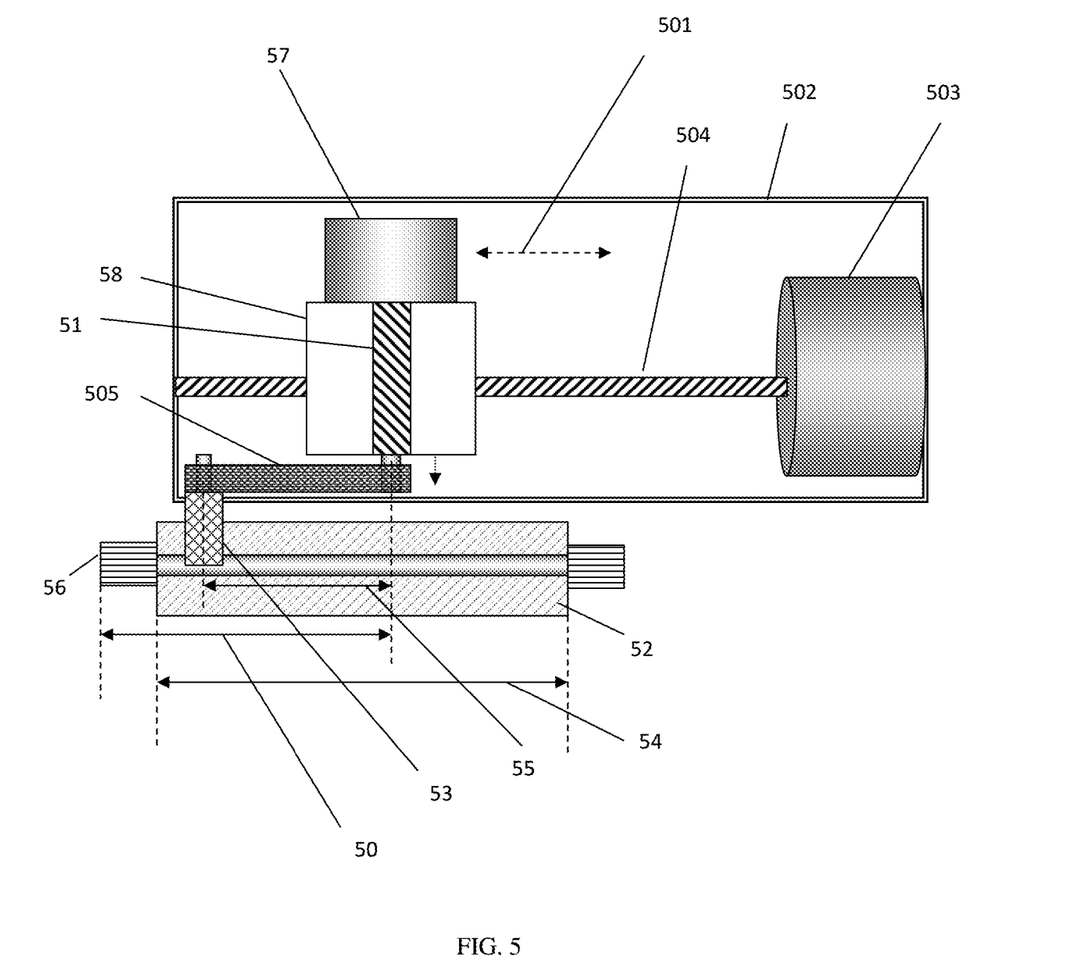
FIG. 5 depicts the cross section of a slide screw tuner with horizontally initialized offset tuning probe and holding bracket.
Figure 6:
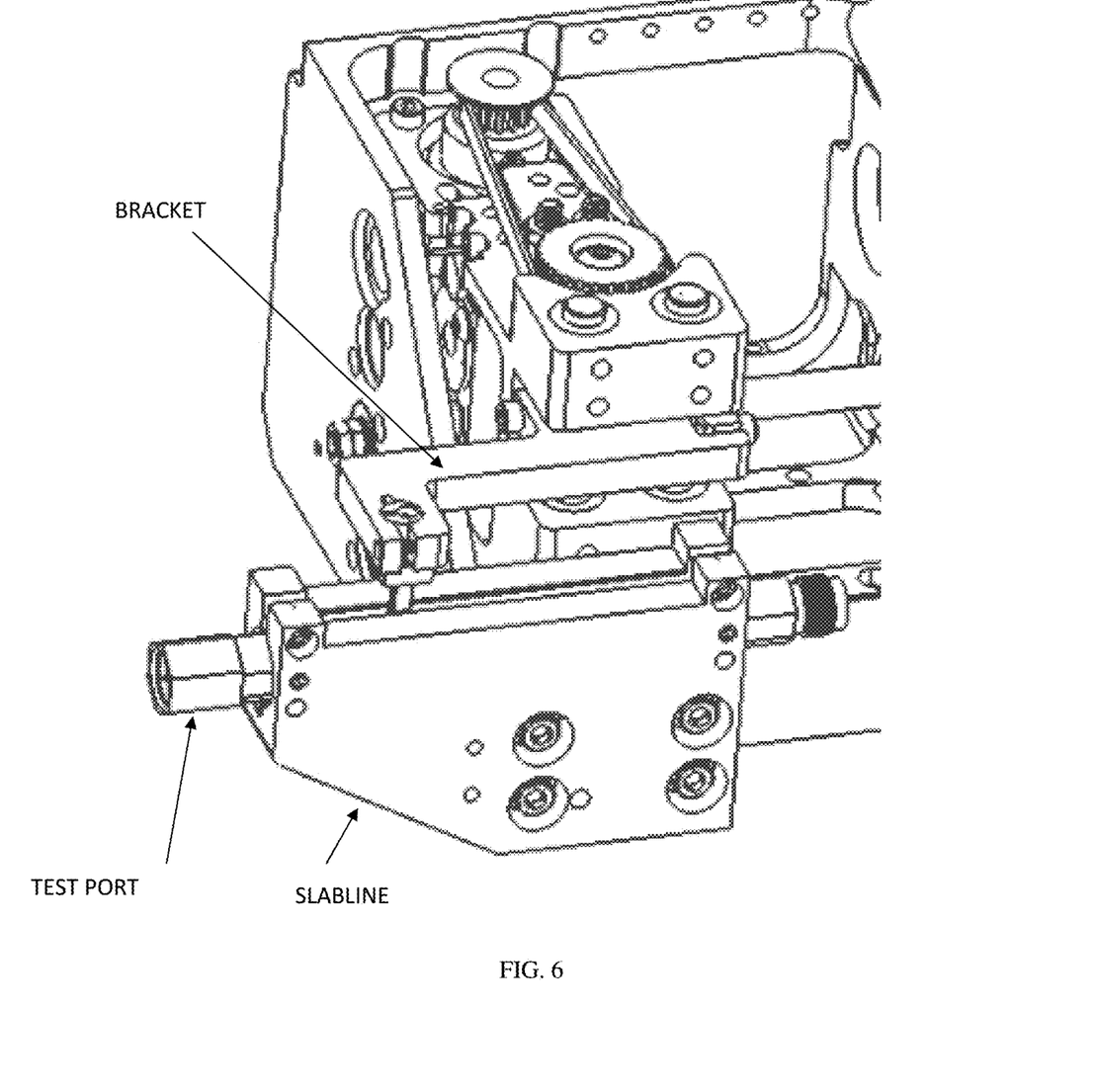
FIG. 6 depicts a realistic perspective 3D view of the tuning area of the tuner of FIG. 5.
Figure 7:
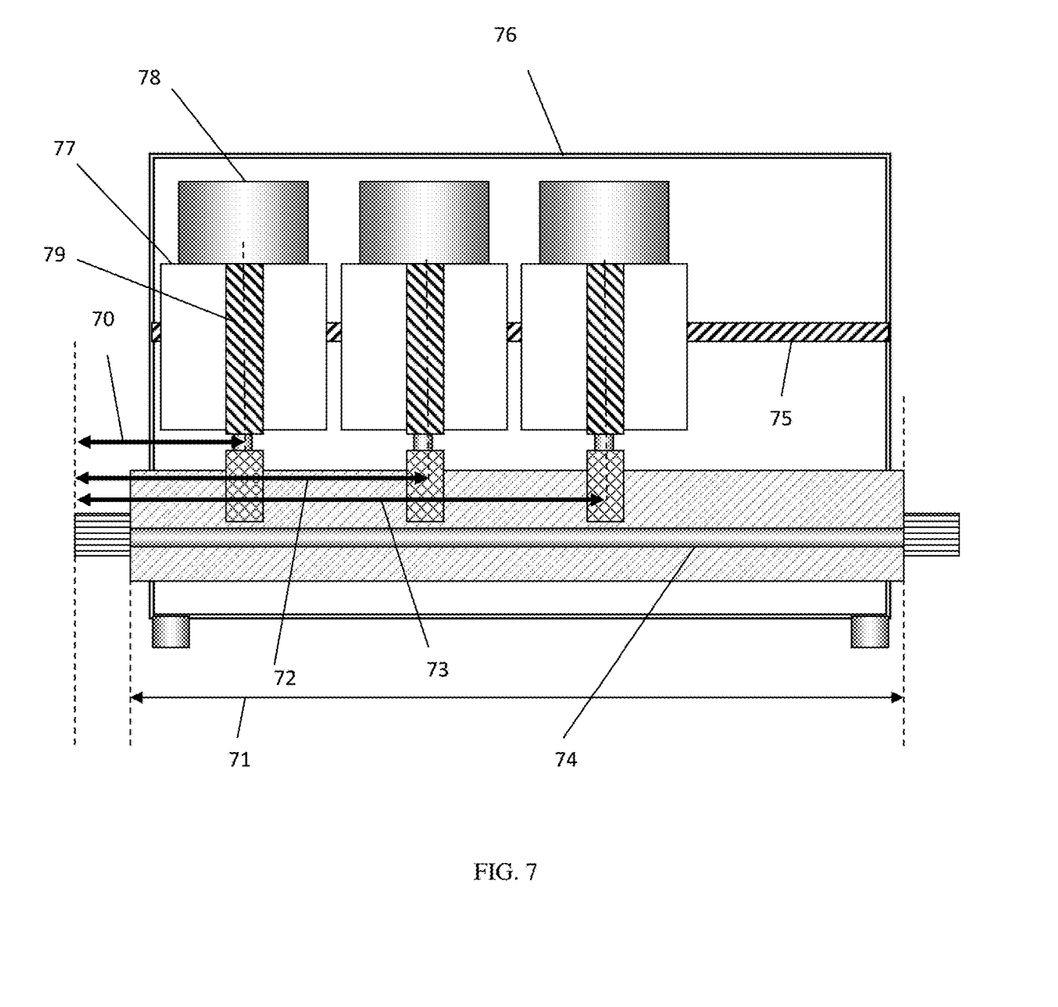
FIG. 7 depicts prior art, a cross section of a slide screw tuner with three horizontally initialized tuning probes.
Figure 11:
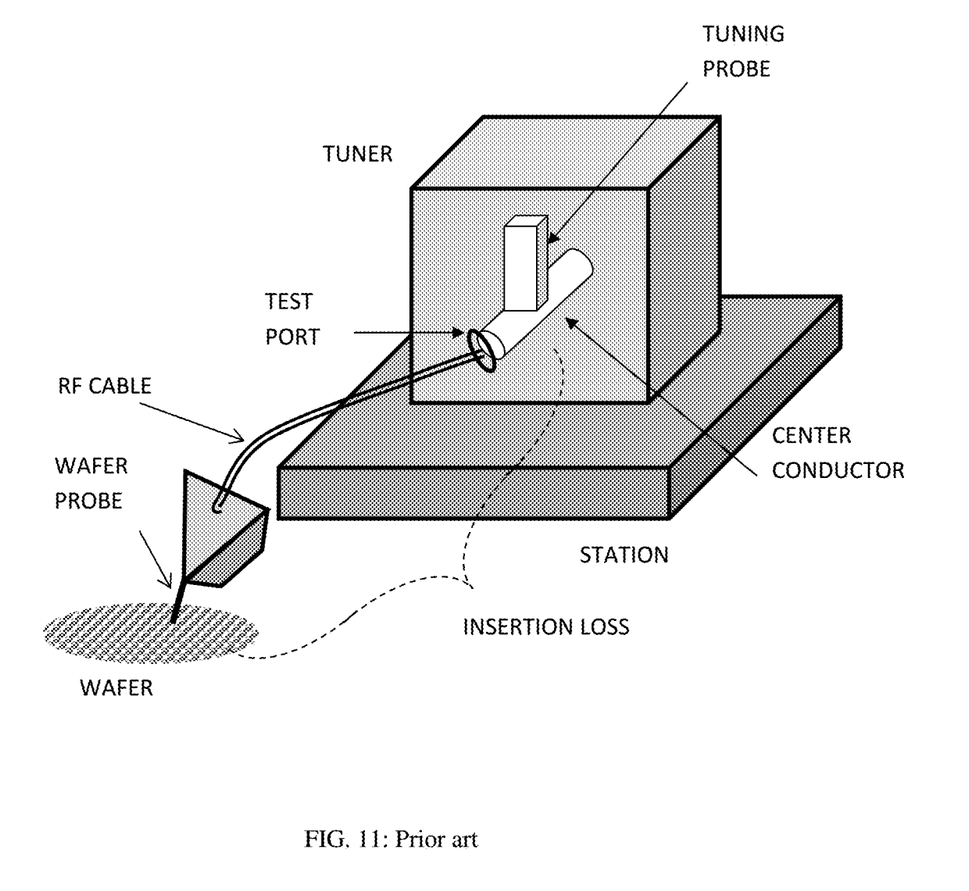
FIG. 11 depicts prior art, causes of insertion loss in an on-wafer test setup using impedance tuners.

The major limitations with passive slide screw tuners are: (a) the insertion loss shown in FIG. 1 as items 10 and 11 and FIG. 11 between the tuner test port and the DUT; the insertion loss reduces the tuning range (FIG. 3); (b) the mechanical width (in horizontal direction) of the mobile carriage(s), especially in multi-carriage tuners, dictates a minimum length of the tuner and the slabline, especially at high frequencies, where the electrical length is short and the center conductor very thin. In short, the sum of the widths of the carriages exceeds the required travel distance of the tuning probes to cover 360 degrees of reflection factor. This is shown in FIGS. 5 and 7.

Figure 8:
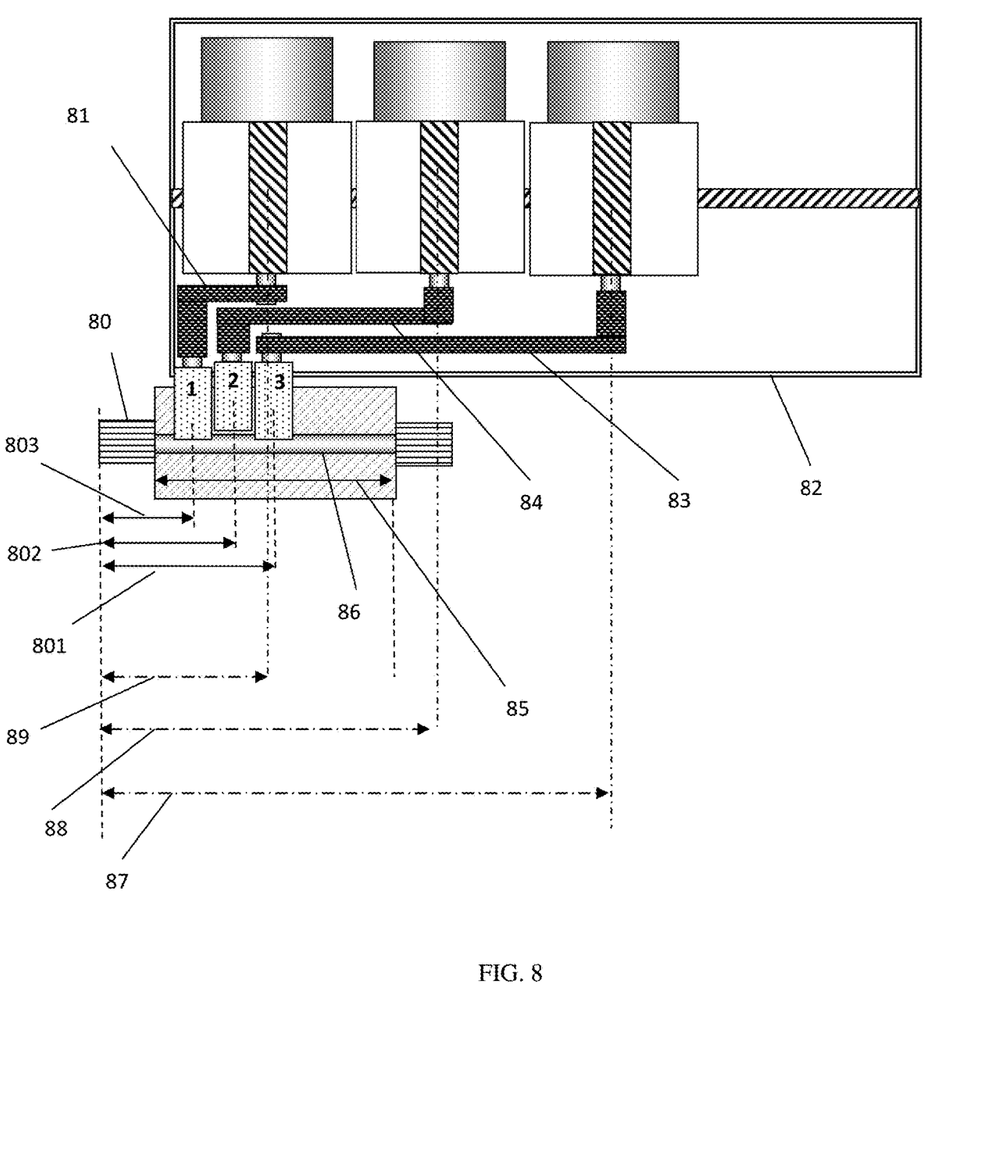
FIG. 8 depicts a cross section of a slide screw tuner with three horizontally initialized offset tuning probes.

In the case (a): Typical internal impedance of microwave power transistors (FIG. 3) is in the area of the spot 30. Whereas the tuning range 32 of the tuner itself can reach this point, after inserting the RF cable (FIG. 11) the tuning range is reduced 33, in which case the impedance at point 30 cannot be reached. This leads to the requirement of minimizing insertion loss (see FIG. 11). Realistically, high power devices having internal impedance in the area of item 31 cannot be reached using traditional passive tuners. Four parts contribute to the insertion loss: (1) the insertion loss of the wafer probe itself; (2) the insertion loss of the RF cable, (3) the insertion loss of the test port adapter, and (4) the insertion loss of the slabline section 20 between test port and tuning probe. This invention discloses a tuner, which eliminates items (2) (the RF cable) and (3) (the test port adapter) and minimizes item (4) (the slabline section between test port and tuning probe). To improve the manufacturability of extremely straight center conductors, case (b), we chose to make the slabline as short as possible. To do so, the invention introduces extended tuning probe brackets (FIGS. 5 and 8). The tuning probes are not mounted coaxially below the vertical axis of the carriages but offset, such that at initialization the tuning probes are placed as close to the test port as physically possible. By minimizing insertion loss, areas in the vicinity of item 31 are reachable. This is most important for millimeter-wave frequencies, where cable and adapter loss are high and item 31 is closer to the center of the Smith chart and can be easily tuned to.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 9:
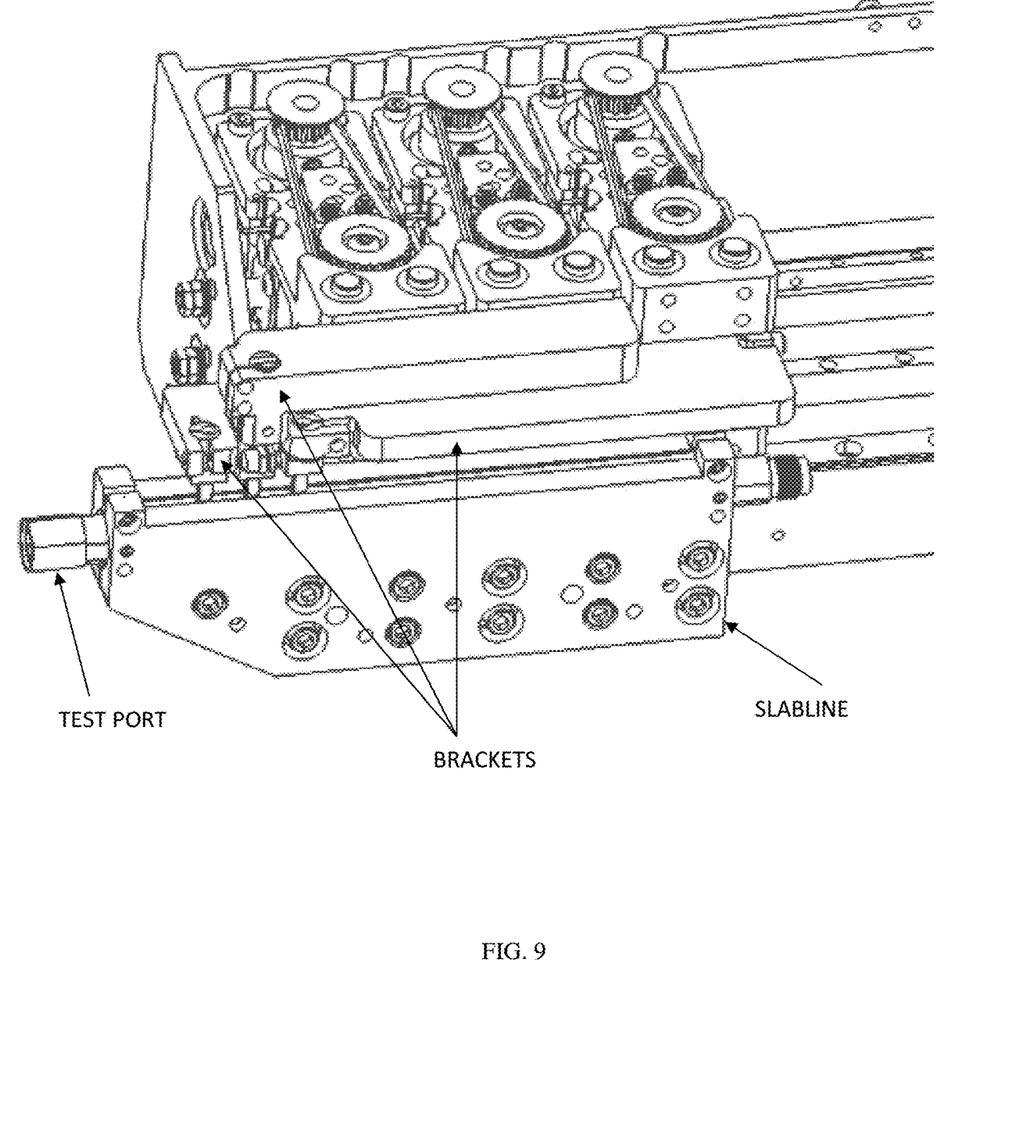
FIG. 9 depicts a magnified 3D view of the tuning section of the tuner of FIG. 10.
Figure 10:
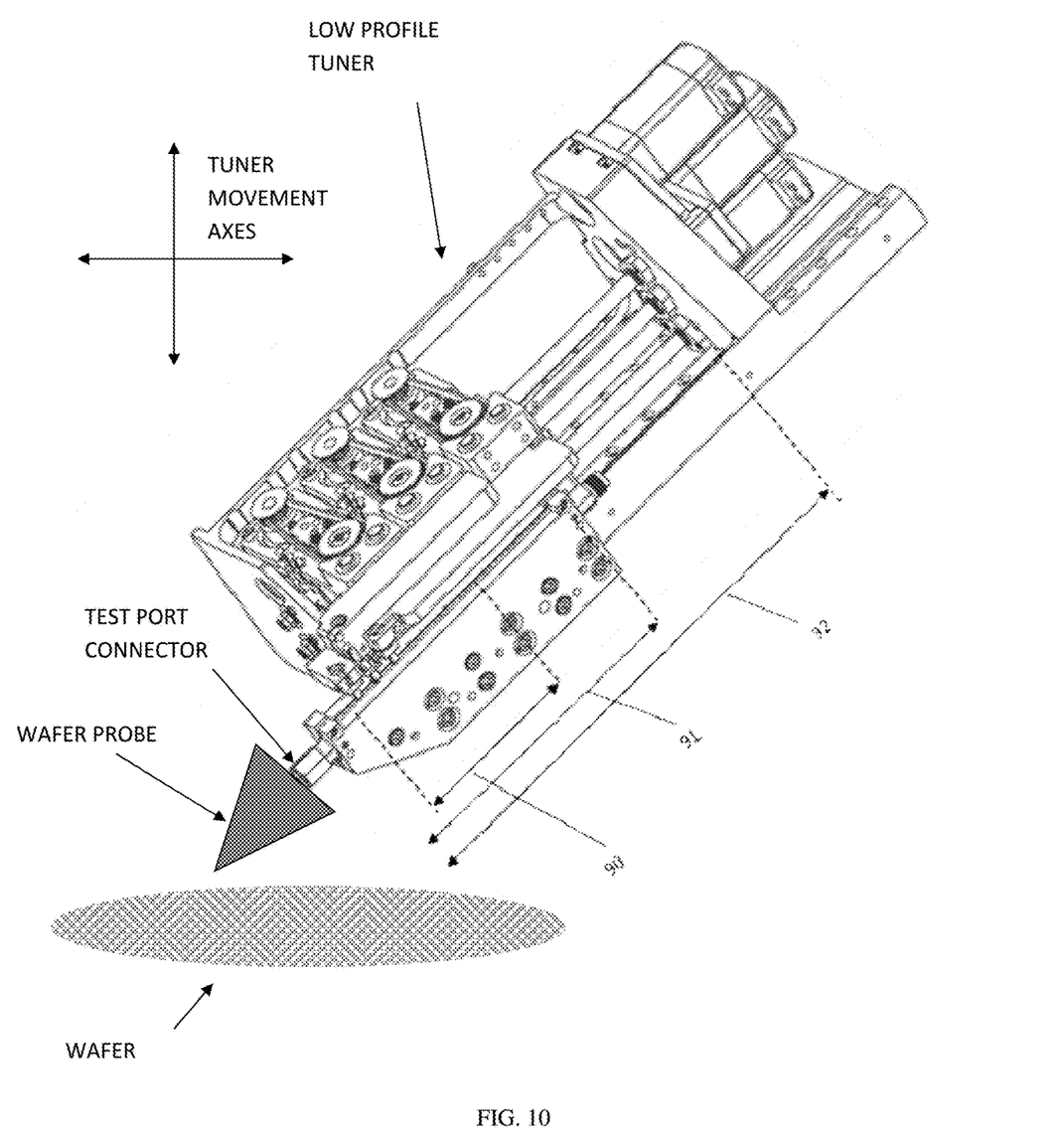
FIG. 10 depicts total 3D view of three probe tuner, mounted under a matching angle and connected directly to the wafer probe.

The new tuner structure is shown in FIGS. 5, 6, 8, 9 and 10. FIG. 5 depicts the single probe tuner. The housing 502 is longer, because it holds the horizontally 501 movable mobile carriage 58, the horizontal motor 503 and the horizontal gear 504 and does not include the shorter slabline 52. The slabline 52 has now as short a length 54, as required by the horizontal travel of the tuning probe 53 to cover 360 degrees of reflection factor at Fmin (lambda/2) and no more. This is possible by using the extension bracket 505 mounted on the vertical axis 51, controlled by motor 57. This way the tuning probe 53 can be placed immediately next to the test port 56. The total length of the slabline 54 can be optimized as a function of Fmin without regard of the auxiliary tuner mechanics. The actual distance 50 between test port 56 and vertical axis 51 is now shortened by the length 55 of the bracket 505. In addition the housing 502 and slabline 52 can be shaped in bullet form (FIG. 10) to approach the tuner to the wafer probe and connect directly with it, eliminating also the need for the RF cable. In this case the tuner is tilted at the same angle as the wafer probe (typically 45 or 30 degrees against the horizontal). FIG. 9 depicts a magnified view of the tuning area of the tuner of FIG. 10 showing in more detail the extended bracket arrangement.

FIG. 7 depicts a traditional three-carriage three-probe P1, P2 and P3 automatic slide screw tuner (see ref. 5). Horizontal carriage control is not shown here, but, as also shown in FIG. 5, it does add to the length of the tuner housing 76, in particular now that three parallel horizontal lead screws 75 are required for independent carriage control. The tuner comprises a solid housing 76, three mobile carriages 77 with vertical motors 78 which control the vertical axes 79. The horizontal carriage position is controlled by acme rod 75 and associated stepper motor (not shown). In normal operation of a traditional tuner the length 71 of the slabline and associated center conductor 74 comprises the width of the three mobile carriages 77 with some security space between them plus the half wavelength section at the minimum frequency Fmin, after the last carriage plus one half carriage width 26 plus the width of the tuning probe resulting in a minimum distance being at least equal to 26. This requires a long 24 and difficult to manufacture center conductor. Regarding the idle slabline section, this amounts to the length 70, dictated by the width of the first carriage 77 and the security space to the housing 76. Similarly the second and third tuning probes are spaced by at least one 72 and two 73 carriage lengths plus the initial space of the first carriage 70. In terms of insertion loss this configuration is heavily disadvantageous. Tuning probes 2 and 3 are masked away by insertion loss and thus inefficient, in particular when tuning at harmonic high frequencies.

All shortcomings of FIG. 7 are eliminated in FIG. 8: This is possible by holding the tuning probes P1, P2 and P3 using brackets 81, 84 and 83 correspondingly and mounting the slabline outside (below) the tuner housing. Wherein the length of the tuner housing 82 is the same as in FIG. 7, item 76 requiring a slabline and center conductor length 71, in the case of the new tuner (FIG. 8) the length of the slabline and center conductor 86 are much shorter 85. It is much easier to make and align a much shorter center conductor. Also the three horizontally initialized tuning probes are much closer to the test port 80 (items 801, 802 and 803) instead of the actual distance of the, equally horizontally initialized, vertical axes (items 89, 88 and 87). In fact length 803 is shorter than length 89 by one half of a carriage width, length 802 shorter than 88 by one carriage width, and length 801 shorter than 87 by two carriage widths. Typical carriage widths being 1" (~25 mm) this corresponds to a distance of 2 wavelengths for tuning probe P1, 4 wavelengths for probe P2 and approximately 10 wavelengths for probe P3 at the frequency of 50 GHz.

FIG. 9 shows the actual tuner configuration. It is impractical to mount the three brackets above each-other, as shown in FIG. 8, because the brackets must be sturdy and rigid enough to guide the tuning probes solidly and repeatedly to the same physical position as instructed by the control software. Therefore the brackets are mounted above and behind each-other to save space, without altering the basic idea demonstrated in FIG. 8.

Figure 12:
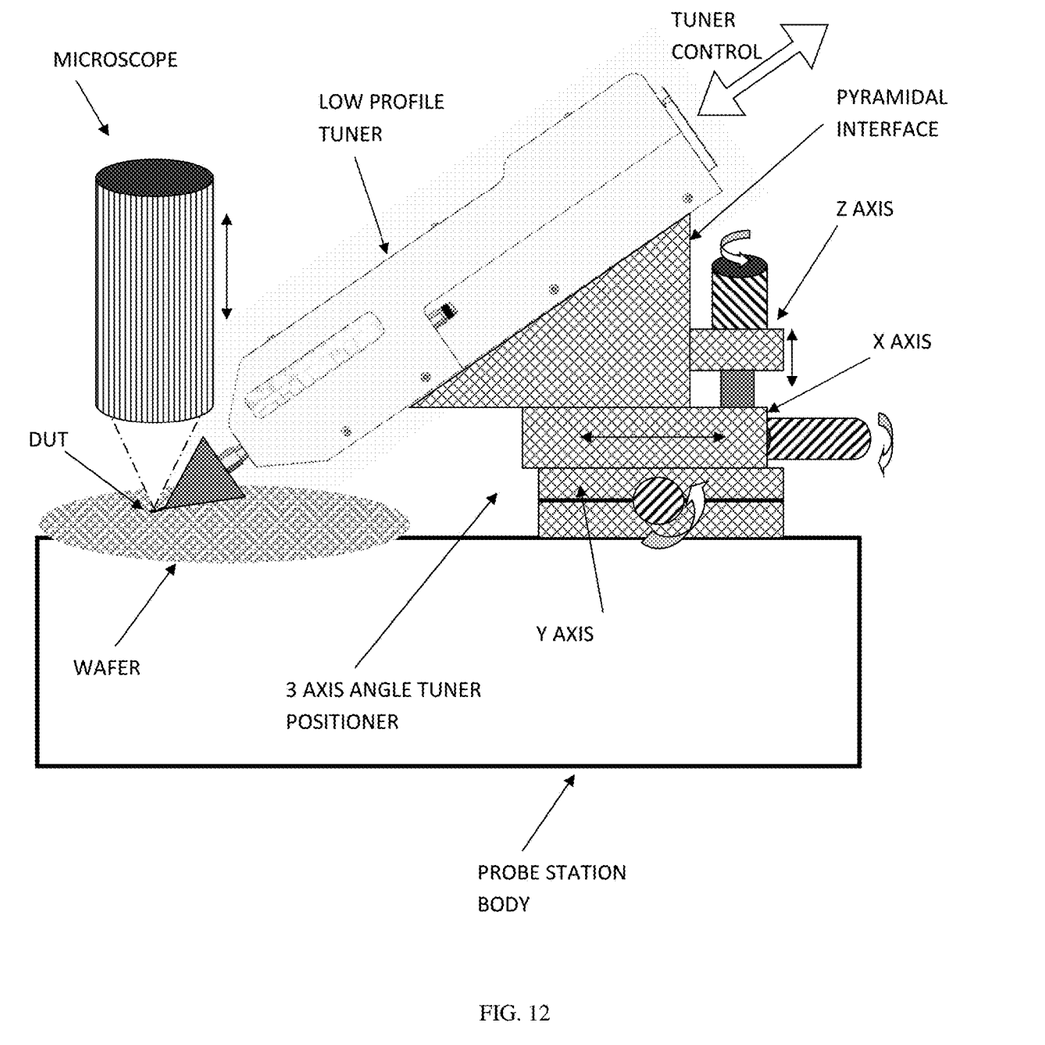
FIG. 12 depicts on-wafer test assembly using low profile tuner with extension brackets and angled tuner positioner.

This new tuner concept also allows mounting at an angle (see FIG. 10). In this case the test port connector can be matched and directly screwed on the coaxial connector of the wafer probe thus eliminating the RF. The additional benefit of using extension brackets is that low profile tuners are now feasible (see FIGS. 10 and 12). Mounting the low profile tuners under an angle matching the wafer-probe angle and connecting directly to it is coaxial connector now possible without conflicting with the microscope (see FIG. 12). FIG. 12 also depicts the basic structure of the modified 3 axis angle tuner positioner. The 3 axis of the tuner positioner are controlled by micrometric screws and fine thread gear to ensure the highest movement resolution. This new positioner is similar to existing 3 axis positioners (see ref. 6) except that the vertical (Z) direction is attached to and moves a pyramidal interface attachment, which adapts the vertical axis of the positioner to the tuner angle. This pyramidal interface body must be exchangeable for wafer-probes with different angle of their coaxial connector. Typical angles of our concern are approximately 30 or 45 degrees. Wafer-probes with 90 degree (vertical) connector are not useable in this application. In laboratory jargon the wafer probes are called and understood as 30, 45 or 90 degree probes.

In summary the proposed tuner configuration (a) eliminates the RF cable, (b) minimizes idle and lossy lengths of transmission line inside the tuner and (c) allows using easier to manufacture and align short straight center conductors. Again the actual required travel length being 90 the center conductor is slightly longer 91 but the prior art configuration would require a center conductor at least 92 long, quasi twice as long. Obviously, a special tuner positioner must allow the tuner to be mounted at the wafer probe angle, but the movement is still horizontal and vertical to reach a specific chip on the semiconductor wafer. This tuner concept is best suited for millimeter-wave frequencies from 25 to 110 GHz and above.

Obvious alternative embodiments to the herein disclosed (a) low profile single and multiple probe electromechanical coaxial slide screw tuners, which use extension brackets and external slabline, and (b) the method of mounting the tuners on probe stations for maximizing the tuning range, operational in the millimeter-wave frequency range, are imaginable and possible, but shall not impede on the validity of the basic idea of the present invention.

What I claim as my invention is:

1. A load pull tuner with merely to improve the grammatical form and externally mounted slabline, comprising
  a) a tuner body,
  b) a slabline, mounted externally to the tuner body, and having a center conductor, a test and an idle port,
  c) at least one, parallel to the slabline sliding, mobile carriage, said at least one carriage having a perpendicular to the slabline movable axis holding metallic tuning probe(s), which are insertable into a slot of the slabline;
wherein
  the tuning probe(s) is/are attached at the perpendicular to the slabline movable axis using extension brackets, and
wherein,
  at initialization, the tuning probe(s) is/are positioned adjacent to each-other next to the test port,
and wherein,
  the total length of the slabline is approximately one half of a wavelength at the lowest frequency of operation plus the total width of the probe(s) in parallel to the slabline length direction.

2. The tuner of claim 1,
wherein
  the test port of the slabline is the test port of the tuner and can be connected directly to a wafer probe.

\* \* \* \* \*

UNITED STATES PATENT AND TRADEMARK OFFICE
CERTIFICATE OF CORRECTION

Page 1 of 1

PATENT NO. : 10,686,239 B1
APPLICATION NO. : 16/569897
DATED : June 16, 2020
INVENTOR(S) : Christos Tsironis It is certified that error appears in the above-identified patent and that said Letters Patent is hereby corrected as shown below:

In the Claims

In Claim 3 (Line 1), "at least one offset tuning probes" has been replaced with --at least one offset tuning probe--.

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*